United States Patent
Sorai et al.

(10) Patent No.: US 9,487,449 B2
(45) Date of Patent: Nov. 8, 2016

(54) CUBIC BORON NITRIDE SINTERED BODY AND METHOD FOR MANUFACTURING THE SAME

(71) Applicant: Sumitomo Electric Hardmetal Corp., Itami-shi (JP)

(72) Inventors: Yoshiaki Sorai, Itami (JP); Katsumi Okamura, Itami (JP); Tomohiro Fukaya, Itami (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 0 days.

(21) Appl. No.: 14/438,573

(22) PCT Filed: Oct. 10, 2013

(86) PCT No.: PCT/JP2013/077574
§ 371 (c)(1),
(2) Date: Apr. 24, 2015

(87) PCT Pub. No.: WO2014/065131
PCT Pub. Date: May 1, 2014

(65) Prior Publication Data
US 2015/0291478 A1    Oct. 15, 2015

(30) Foreign Application Priority Data
Oct. 26, 2012 (JP) .................. 2012-237019

(51) Int. Cl.
*C04B 35/5831* (2006.01)
*C04B 35/645* (2006.01)
(Continued)

(52) U.S. Cl.
CPC ........... *C04B 35/5831* (2013.01); *B22F 1/025* (2013.01); *B28B 1/004* (2013.01);
(Continued)

(58) Field of Classification Search
CPC .................................. C04B 35/5831
See application file for complete search history.

(56) References Cited

U.S. PATENT DOCUMENTS 4,619,698 A * 10/1986 Ueda ................. B01J 3/062
419/12
5,830,813 A    11/1998 Yao et al.
(Continued)

FOREIGN PATENT DOCUMENTS

CN    1636935 A    7/2005
CN    102731097 A    10/2012
(Continued)

OTHER PUBLICATIONS

International Search Report in PCT International Application No. PCT/JP2013/077574, dated Dec. 10, 2013.
(Continued)

*Primary Examiner* — Karl Group
(74) *Attorney, Agent, or Firm* — Venable LLP; Michael A. Sartori; F. Brock Riggs

(57) ABSTRACT

A cubic boron nitride sintered body includes cubic boron nitride, a binder, and a metal catalyst element, a content by percentage of the cubic boron nitride is 50 vol % or more and 85 vol % or less, a content by percentage of the catalyst is 0.5 mass % or more and 5 mass % or less. A sum of a detected peak value of nitrogen and a detected peak value of boron at each of arbitrary measurement points on line segments is calculated, a measurement point at which the sum is a half or less of a maximum value among the sums at all measurement points respectively is identified as a binder-portion measurement point, and a ratio of the number of measurement points at which the catalyst element is not detected among the binder-portion measurement points, to a total number of all binder-portion measurement points, is 30% or less.

2 Claims, 7 Drawing Sheets

(51) Int. Cl.
  *C22C 26/00* (2006.01)
  *B28B 1/00* (2006.01)
  *C23C 14/16* (2006.01)
  *C23C 14/34* (2006.01)
  *B22F 1/02* (2006.01)
  *C23C 16/00* (2006.01)
  *C23C 14/22* (2006.01)

(52) U.S. Cl.
  CPC ............ *C04B 35/645* (2013.01); *C22C 26/00* (2013.01); *C23C 14/165* (2013.01); *C23C 14/223* (2013.01); *C23C 14/34* (2013.01); *C23C 16/00* (2013.01); *B22F 2999/00* (2013.01); *C04B 2235/3256* (2013.01); *C04B 2235/3839* (2013.01); *C04B 2235/40* (2013.01); *C04B 2235/405* (2013.01); *C04B 2235/72* (2013.01); *C04B 2235/785* (2013.01); *C04B 2235/96* (2013.01); *C22C 2026/003* (2013.01)

(56) References Cited

U.S. PATENT DOCUMENTS

| | | | |
|---|---|---|---|
| 6,001,758 A | 12/1999 | Fukaya et al. | |
| 2005/0143252 A1 | 6/2005 | Okamura et al. | |
| 2008/0214383 A1 | 9/2008 | Matsukawa et al. | |
| 2012/0230786 A1 | 9/2012 | Matsuda et al. | |
| 2012/0282050 A1 | 11/2012 | Setoyama et al. | |
| 2012/0302425 A1 | 11/2012 | Okamura et al. | |
| 2013/0000213 A1 | 1/2013 | Okamura et al. | |
| 2013/0309468 A1* | 11/2013 | Kudo .................. | C04B 35/583 428/216 |
| 2015/0110663 A1* | 4/2015 | Weinl ................. | B22F 3/10 419/12 |

FOREIGN PATENT DOCUMENTS

| | | | |
|---|---|---|---|
| EP | 0839776 A2 | | 5/1998 |
| JP | 58061255 | * | 4/1983 |
| JP | 61-168569 | | 7/1986 |
| JP | 10-182242 | | 7/1998 |
| JP | H11-505483 A | | 5/1999 |
| JP | H11-505770 A | | 5/1999 |
| JP | 2010213037 | * | 4/2010 |
| JP | 2010513037 | * | 4/2010 |
| JP | 2010-235369 A | | 10/2010 |
| JP | 2011-207690 A | | 10/2011 |
| WO | WO-96/36465 A1 | | 11/1996 |
| WO | WO-2005/066381 A1 | | 7/2005 |
| WO | WO-2008/074010 A1 | | 6/2008 |
| WO | WO-2011/111261 A1 | | 9/2011 |
| WO | WO-2012/053375 A1 | | 4/2012 |
| WO | WO-2012/053507 A1 | | 4/2012 |
| WO | WO-2012-056758 A1 | | 5/2012 |
| WO | 2012105710 | * | 8/2012 |
| WO | WO-2012/144502 A1 | | 10/2012 |

OTHER PUBLICATIONS

Notification of the First Office Action in Chinese Patent Application No. 2013800558505, dated Dec. 30, 2015.
Notice of Grounds of Rejection in Japanese Patent Application No. 2012-237019, mailed Apr. 12, 2016.
Extended European Search Report in European Application No. 13848302.9 dated Jun. 2, 2016.
Decision to Grant Patent in Japanese Patent Application No. 2012-237019, mailed Jul. 12, 2016.

* cited by examiner

CUBIC BORON NITRIDE SINTERED BODY AND METHOD FOR MANUFACTURING THE SAME

TECHNICAL FIELD

The present invention relates to a cubic boron nitride sintered body and a method for manufacturing the same, and particularly relates to a cubic boron nitride sintered body including a binder and a catalyst and a method for manufacturing the same.

BACKGROUND ART

A cubic boron nitride (hereinafter referred to as "cBN") sintered body has the second highest hardness next to diamond and has a feature of not reacting with an iron-based material, and is therefore conventionally used in a cutting tool for an iron-based material (Japanese Patent Laying-Open No. 2011-207690 for example).

It is considerably difficult to directly sinter cBN particles (powder) alone, and therefore, a cBN sintered body commonly used in a cutting tool is manufactured by using a ceramic material such as TiC or TiN as a binder and sintering a cBN powder under a ultrahigh pressure.

Further, the conventional cBN sintered body contains, in some cases, a catalyst element which is at least one selected from the group consisting of cobalt (Co), chromium (Cr), nickel (Ni), and molybdenum (Mo) for the purpose of improving the fracture resistance. In this case, the catalyst element is added for the purpose of improving the toughness of the cBN sintered body to thereby improve the fracture resistance. The catalyst element is a metal element and thus has ductility. The ductility, however, makes it difficult to mill and mix the catalyst element with the cBN powder.

In view of the above, the conventional cBN sintered body is produced in the following way. Namely, a powdered catalyst element is prepared by using a catalyst element in the form of a compound such as carbide or nitride, and a mixture of the catalyst element powder and a cBN powder is sintered.

CITATION LIST

Patent Document

PTD 1: Japanese Patent Laying-Open No. 2011-207690

SUMMARY OF INVENTION

Technical Problem

In the conventional cBN sintered body, however, the catalyst element in the powder form is mixed with the cBN powder (hereinafter also referred to as "powder mixing") as described above and thus, in some cases, the catalyst element is not uniformly dispersed in the resultant cBN sintered body. Further, it is known that the catalyst element has its hardness lower than that of cBN and therefore use of a large amount of the catalyst element causes deterioration of the wear resistance. Therefore, in the case where the amount of the added catalyst element should be small in terms of the wear resistance for example, the catalyst element cannot sufficiently produce the effect of improving the fracture resistance of the cBN sintered body.

The present invention has been made to solve the above-described problem. A chief object of the present invention is to provide a cubic boron nitride sintered body that can have an improved fracture resistance with the amount of an added catalyst element kept small, and provide a method for manufacturing the same.

Solution to Problem

The cubic boron nitride sintered body of the present invention is a cubic boron nitride sintered body including cubic boron nitride, a binder, and a catalyst element of a metal, a content by percentage of the cubic boron nitride is 50 vol % or more and 85 vol % or less, and a content by percentage of the catalyst element is 0.5 mass % or more and 5 mass % or less. The binder includes: at least one selected from the group consisting of nitrides, carbides, borides, and oxides of Group 4a elements, Group 5a elements, and Group 6a elements in the periodic table, and solid solutions thereof; and an aluminum compound.

Accordingly, in the cubic boron nitride sintered body, the catalyst element can be dispersed in the binder, which enables the fracture resistance of the cubic boron nitride sintered body to be improved.

The catalyst element may include at least one element selected from the group consisting of cobalt (Co), chromium (Cr), nickel (Ni), and molybdenum (Mo).

An image obtained through observation of a region of 8 $\mu m \times 8$ $\mu m$ of a structure of the cubic boron nitride sintered body of the present invention with a scanning transmission electron microscope is divided along line segments into partial regions in four rows and four columns, a composition analysis is performed on the line segments, and a sum of a detected peak value of nitrogen (N) and a detected peak value of boron (B) at each of arbitrary measurement points on the line segments is calculated, a measurement point at which the sum is a half or less of a maximum value among the sums at all measurement points respectively is identified as a binder-portion measurement point, and a ratio of the number of measurement points at which the catalyst element is not detected among the binder-portion measurement points, to a total number of all binder-portion measurement points can be 30% or less.

When a content by percentage of the cubic boron nitride is 70 vol % or more and 80 vol % or less, the cubic boron nitride sintered body can have a bending strength of more than 125 kgf/mm$^2$.

A method for manufacturing a cubic boron nitride sintered body of the present invention includes the steps of, preparing a powder of cubic boron nitride; producing a catalyst-attached powder by attaching a catalyst element of a metal to a surface of the powder, mixing the catalyst-attached powder with a binder; and sintering a mixture of the catalyst-attached powder and the binder.

In this way, a cubic boron nitride sintered body in which the catalyst element is dispersed in the binder and the fracture resistance is excellent can be produced The step of producing a catalyst-attached powder may include the step of covering the surface of the powder with a film including the catalyst element through physical vapor deposition.

Advantageous Effects of Invention

In accordance with the present invention, a cubic boron nitride sintered body that can have an improved fracture resistance while the amount of an added catalyst element is kept small, and a method for manufacturing the same can be provided.

DESCRIPTION OF EMBODIMENTS

In the following, an embodiment of the present invention will be described.

A cBN sintered body in the present embodiment includes cBN, a binder, and a catalyst element made up of Co and Cr. In the cBN sintered body, the content by percentage of the cBN is 80 vol %. The binder includes: at least one selected from the group consisting of nitrides, carbides, borides, and oxides of Group 4a elements, Group 5a elements, and Group 6a elements in the periodic table, and solid solutions thereof; and an aluminum compound. In the cBN sintered body in the present embodiment, the binder is made up of Ti, N, and Al. In the cBN sintered body in the present embodiment, the content by percentage of the binder is 20 vol %, and the total content by percentage of the catalyst element made up of Co and Cr is 3 mass %.

Here, in the cBN sintered body in the present embodiment, Co and Cr are dispersed in the binder. Namely, cBN crystal particles are bound together through the binder made up of Ti, N, and Al, and Co and Cr are not locally located but dispersed in the binder.

Figure 1:
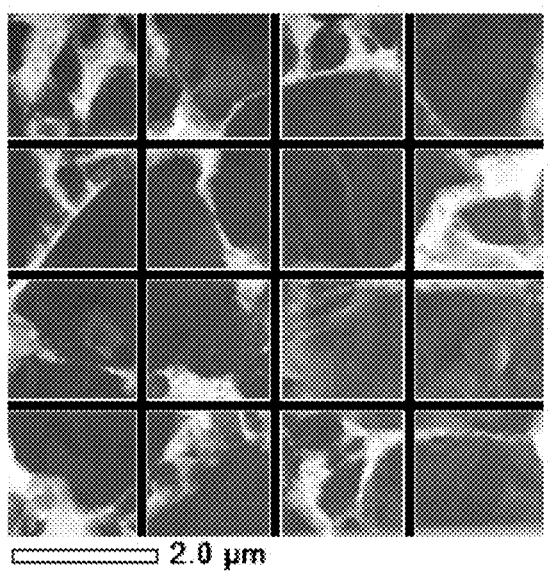
FIG. 1 is a diagram for illustrating a method for evaluating dispersion of a catalyst element in a binder, in a cBN sintered body in the present embodiment.

This can be confirmed through a line analysis performed on an image which is obtained through observation, with a scanning transmission electron microscope, of a structure of the cubic boron nitride sintered body in the present embodiment. Specifically, referring to FIG. 1, a region of 8 μm×8 μm of a cubic boron nitride sintered body is observed with a scanning transmission electron microscope, an image thereby obtained is divided along line segments into partial regions (16 regions of the same size) in four rows and four columns, and a composition analysis such as EDX is performed on the line segments. Based on the obtained spectrum, a measurement point at which the sum of a detected peak value of nitrogen (N) and a detected peak value of boron (B) is a half or less of a maximum value among the sums at all measurement points respectively is identified as a binder-portion measurement point. Namely, a region where the sum of a detected peak value of N and a detected peak value of B is more than a half of the maximum value among the sums at all measurement points respectively is identified as a cBN measurement point where the cBN is present, while a region where the sum is a half or less of the maximum value among the sums at all measurement points respectively is identified as a binder-portion measurement point where the binder made up of Ti, N, and Al is located.

Here, in the cubic boron nitride sintered body in the present embodiment, a ratio of the number of measurement points at which none of Co and Cr is detected, to the total number of measurement points identified as the binder-portion measurement points, is 30% or less. In Examples described later herein, a cBN powder coated with CoCr through RF sputtering PVD and a binder powder (powder produced by mixing TiN and Al) were mixed and sintered to thereby produce a cBN sintered body in which the content by percentage of cBN was 80 vol % and the total content by percentage of Co and Cr was 3 mass %, and this cBN sintered body had the above-defined ratio of 23.6%. In contrast, in Comparative Examples described later herein, a cBN powder, a binder powder, and a powder of a catalyst element were mixed and sintered to thereby produce a cBN sintered body in which the content by percentage of cBN was 80 vol % and the total content by percentage of Co and Cr was 3 mass %, and this cBN sintered body had the above-defined ratio of 38.4%. Thus, the catalyst element in the cBN sintered body of the Examples is more uniformly dispersed in the binder, as compared with the Comparative Examples.

Namely, in the cBN sintered body in the present embodiment, Co and Cr which are the catalyst elements are dispersed in the binder, and therefore, the cBN in the cBN sintered body can be made in contact with Co and Cr in a broader region. In contrast, the conventional cBN sintered body is produced by adding to cBN the catalyst element in the powder form through powder mixing, and therefore, the catalyst element is unevenly distributed in the binder of the cBN sintered body. Due to this, in the conventional cBN sintered body, cBN and the catalyst element cannot adequately be made in contact with each other unless the content by percentage of the catalyst element is increased.

As seen from the above, in the cBN sintered body in the present embodiment, cBN and the catalyst element can be made in contact with each other in a broader region. Therefore, with the amount of the added catalyst element kept at 5 mass % or less, the catalyst element can produce the effect of improving the fracture resistance.

In the cBN sintered body in the present embodiment, catalyst elements Co and Cr are more uniformly dispersed in the binder as described above. It can therefore be confirmed, from the Examples described later herein, that the bending strength is 115 kgf/mm$^2$ or more when the content by percentage of the catalyst elements is 1.5 mass % and 5 mass %. In particular, it can be confirmed from the Examples described later herein, that a cBN sintered body in which the content by percentage of cBN is 70 vol % or more and 80 vol % or less has a bending strength of more than 125 kgf/mm$^2$ when the content by percentage of the catalyst elements is 0.5 mass % and 5 mass %.

The cBN sintered body in the present embodiment is excellent in toughness in addition to the bending strength as described above. The inventors of the present invention have evaluated the toughness in the following way. With a tool in which a cBN sintered body was used, a work material of Steel Type SKD11-6V defined under JIS G4404, with a hardness HRC of 64, 100 mm in diameter×300 mm in length, and six V-shaped grooves in the axial direction on the surface, was intermittently cut under the conditions that the cutting rate was 100 m/min, the feed rate was 0.2 mm/rev, and the cut size was 0.15 mm. Then, time elapsed before occurrence of fracture to the cBN sintered body was evaluated. It is seen from the Examples described later herein that the time elapsed before occurrence of fracture to the cBN sintered body in the present embodiment is longer by 5% or more, as compared with the conventional cBN sintered body containing the catalyst elements substantially identical in content to the present embodiment. Namely, the cBN sintered body in the present embodiment is superior in bending strength and toughness and excellent in fracture resistance as compared with the conventional cBN sintered body.

Figure 2:
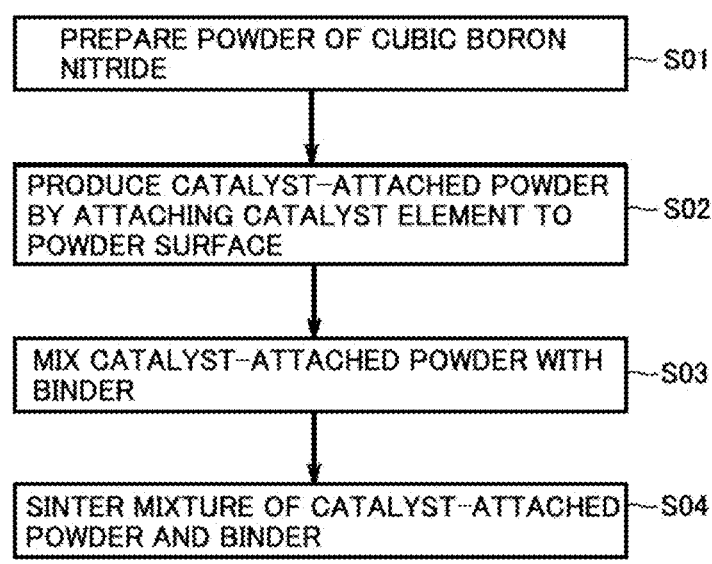
FIG. 2 is a diagram showing a flow of a method for manufacturing a cBN sintered body in the present embodiment.

Referring next to FIG. 2, a method for manufacturing a cBN sintered body in the present embodiment will be described. The method for manufacturing a cBN sintered body in the present embodiment includes the steps of: preparing a cBN powder (S01); producing a catalyst-attached powder by attaching a catalyst element to a surface of the cBN powder (S02); mixing the catalyst-attached powder with a binder (S03); and sintering a mixture of the catalyst-attached powder and the binder (S04).

Initially, in the step (S01), a cBN powder having an average particle size of 0.5 μm or more and 5.0 μm or less is prepared.

Next, in the step (S02), Co and Cr which are catalyst elements are attached through RF sputtering PVD to a surface of the cBN powder prepared in the preceding step (S01). Specifically, a solid metal material (target) produced by alloying Co with Cr at a content ratio of 1:1 is used to produce a cBN powder coated with CoCr (50:50). The deposition conditions for the sputtering PVD may be determined based on a standard curve for the sputtering time and the coating amount, so that a desired coating amount is achieved. In the present embodiment, under the condition that the content by percentage of Co and Cr is 3 mass % in the cBN sintered body, Co and Cr are deposited on the surface of the cBN powder.

Next, in the step (S03), the cBN powder coated with CoCr (50:50) produced in the preceding step (S02) and a binder are mixed together. At this time, the binder is prepared in the following way. A powder mixture of TiN and Al is heat-treated in vacuum at a temperature of 1200° C. for 30 minutes, a resultant compound is milled and mixed with a planetary ball mill to thereby prepare a powder. The blending ratio between the catalyst-attached cBN powder and the binder powder is determined so that a predetermined cBN content by percentage is achieved in the produced cBN sintered body. In the present embodiment, they are blended together so that the content by percentage of cBN is 80 vol %. After the catalyst-attached cBN powder and the binder powder are blended together, they are uniformly mixed together by means of a planetary ball mill using a pot having a Teflon® inner wall and balls made of $Si_3N_4$. Further, the mixed catalyst-attached cBN powder and binder powder are degassed by being held in a vacuum furnace at a temperature of 900° C. for 20 minutes.

Next, in the step (S04), the powder mixture of the binder powder and the cBN powder coated with CoCr (50:50) obtained in the preceding step (S03) is placed in a capsule made of Mo, thereafter held at a pressure of 5.8 GPa and a temperature of 1400° C. for 20 minutes by means of an ultrahigh pressure apparatus, and accordingly sintered. In this way, the cBN sintered body in the present embodiment can be produced.

As seen from the foregoing, the cBN sintered body in the present embodiment is produced by mixing a cBN powder, which has a surface coated with a catalyst element, with a binder, and sintering the mixture. Accordingly, in the cBN sintered body, the catalyst element can be included in the dispersed state in the binder. As a result, in the cBN sintered body in the present embodiment, the ratio of the catalyst element which is in contact with cBN to the whole added catalyst element is high. Therefore, the cBN sintered body can have a superior fracture resistance regardless of a low content by percentage of the catalyst element of 5 mass % or less.

While the content by percentage of cBN in the cBN sintered body in the present embodiment is 80 vol %, the content is not limited to this and may be determined arbitrarily in a range of 50 vol % or more and 85 vol % or less. It is seen from the Examples described later herein that a cBN sintered body in which the content by percentage of cBN is 60 vol % or more and 90 vol % or less is superior in both the bending strength and the toughness to the conventional cBN sintered body produced through the powder mixing. It is considered that, even when the content by percentage of cBN is 50 vol % or more, a cBN sintered body having similar characteristics can be obtained.

Further, while the cBN sintered body in the present embodiment includes Co and Cr as catalyst elements, the catalyst element is not limited to this. The catalyst element may be made up of at least one element selected from the group consisting of Co, Cr, Ni, and Mo. Even in this case, the cBN sintered body in which this catalyst element is added can have a superior fracture resistance.

Further, while 3 mass % of the catalyst element is added in the cBN sintered body in the present embodiment, the catalyst element is not limited to this. The amount of the catalyst element included in the cBN sintered body may be any as long as the amount is 0.5 mass % or more and 5 mass % or less. It can be confirmed from the Examples described later herein that a cBN sintered body in which 1.5 mass % of Co and Cr in total is added and a cBN sintered body in which 5 mass % of Co and Cr in total is added are superior in toughness and bending strength to the conventional cBN sintered body. It is thus considered that a cubic boron nitride composite polycrystal having similar characteristics can be obtained as long as the amount of the added catalyst element is 0.5 mass % or more and 5 mass % or less.

Further, while the binder in the cBN sintered body in the present embodiment is prepared from a powder mixture of TiN and Al, the binder is not limited to this. As described above, the composition may be any as long as the binder is a ceramic-based binder including: at least one selected from the group consisting of nitrides, carbides, borides, and oxides of Group 4a elements, Group 5a elements, and Group 6a elements in the periodic table, and solid solutions thereof; and an aluminum compound. For example, the binder may be prepared from a powder mixture of Ti (CN) and Al.

Further, while the method for coating the surface of the cBN powder with the catalyst element in the step (S02) of the method for manufacturing a cBN sintered body in the present embodiment uses the sputtering PVD, the method is not limited to this. For example, plating or the like may also be used. In this way as well, the surface of the cBN powder can be coated with the catalyst element.

Further, regarding the method for manufacturing a cBN sintered body in the present embodiment, the conditions for sintering by means of an ultrahigh pressure apparatus in the step (S04) are not limited to the above-described conditions. As long as the conditions enable cBN to be sintered, any conditions may be selected.

In the following, Examples of the present invention will be described

Example 1

As cBN sintered bodies in the embodiment of the present invention, 14 different cBN sintered bodies in which the content by percentage of cBN was 60 vol % to 90 vol % and the content by percentage of the catalyst element (CrCo) was 1.5 mass % and 5 mass % were produced, and their bending strength and toughness were evaluated.

Example Samples

First, following the method for manufacturing a cBN sintered body in the present embodiment, a cBN powder having an average particle size of approximately 1.2 μm was prepared in the step (S01), and the surface of the cBN powder was coated with CoCr (50:50) through the sputtering PVD in the step (S02). At this time, deposition was done under two different sets of sputtering conditions so that CoCr in the cBN sintered body was 1.5 mass % and 5 mass % in total, and accordingly two kinds of catalyst-attached cBN powders were produced. In the step (S03), a compound obtained through heat treatment of a mixture of TiN and Al was milled and mixed as described above to produce a binder powder, and the binder powder was mixed with the two kinds of the catalyst-attached cBN powders to thereby produce mixtures. At this time, they were blended so that the content by percentage of cBN in the cBN sintered body was 60 vol %, 65 vol %, 70 vol %, 75 vol %, 80 vol %, 85 vol %, and 90 vol %. Namely, in the step (S03), 14 kinds of mixtures were produced. The 14 kinds of mixtures were held at a pressure of 5.8 GPa and a temperature of 1400° C. for 20 minutes and thereby sintered in the step (S04). Accordingly, 14 kinds of cBN sintered bodies were produced.

Comparative Example Samples

Initially, a cBN powder having an average particle size of approximately 1.2 μm and a catalyst element, specifically a powder of Co carbide and Cr carbide having an average particle size of 0.5 μm were prepared at a weight ratio of 1:1. As a binder, a mixture of TiN and Al was heat-treated and the resultant compound was milled and mixed to thereby produce a powder. 14 kinds of mixtures of the cBN powder, the catalyst element powder, and the binder powder in which the blending ratios were similar to those of the Example samples were produced. They were held at a pressure of 5.8 GPa and a temperature of 1400° C. for 20 minutes and accordingly sintered. Thus, 14 kinds of cBN sintered bodies were produced. Metal elements have ductility or malleability and are therefore considerably difficult to be milled into nano levels by the current technology. Therefore, a method is used according to which the metal elements in the form of compounds such as carbide, nitride, carbonitride, oxide, and the like are produced so that they have no ductility or malleability, milled into fine particles, and added to the binder. The compounds, however, do not have the catalytic function. In view of this, the present invention uses the above-described coating method according to which the cBN powder is coated with a metal catalyst element. If the metal element can be milled into fine particles, the resultant metal fine particles can be added to the cBN powder and they can be mixed together, so that the equivalent effects to the present invention can be achieved.

It should be noted that the content by percentage of the catalyst element in the cBN sintered bodies of the Example samples and the Comparative Example samples was measured in accordance with the ICP method.

Experiment 1

Figure 3:
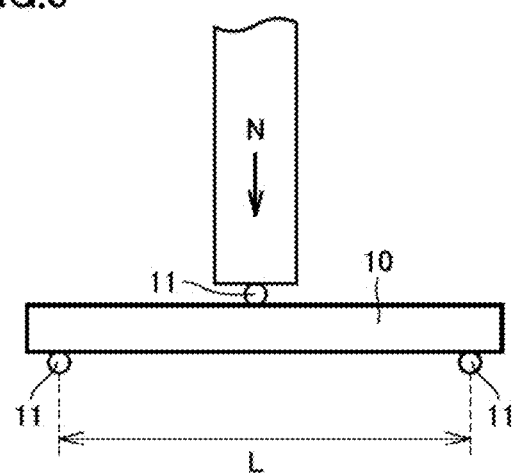
FIG. 3 is a diagram for illustrating a test method for Experiment 1 in Example 1 of the present invention.

Referring to FIG. 3, in Experiment 1, the bending strength of the Example samples to be evaluated and the Comparative Example samples to be evaluated was evaluated. Specifically, a specimen 10 which was a cBN sintered body in a rectangular shape having a length of 6 mm, a width of 3 mm, and a thickness of 0.5 mm was provided, and this specimen 10 was placed on two supports 11 arranged with an interval L of 4 mm therebetween. To a central point between these supports 11, a load N was applied. A load N applied at the time breakage occurred to specimen 10 of the cBN sintered body was measured as a bending strength. Support 11 had a diameter of 2 mm. The results of the measurement are shown in Table 1.

Results of Experiment 1

TABLE 1

| | Example Samples | | Comparative Example Samples | |
|---|---|---|---|---|
| cBN content (mass %) | catalyst element content 1.5 mass % bending strength (kgf/mm$^2$) | catalyst element content 5 mass % bending strength (kgf/mm$^2$) | catalyst element content 1.5 mass % bending strength (kgf/mm$^2$) | catalyst element content 5 mass % bending strength (kgf/mm$^2$) |
| 60 | 118.9 | 120.2 | 102.3 | 109.2 |
| 65 | 120.2 | 119.2 | 108.2 | 115.2 |
| 70 | 128.5 | 125.8 | 112.0 | 120.1 |
| 75 | 136.6 | 132.6 | 117.7 | 125.0 |
| 80 | 130.0 | 128.4 | 120.3 | 122.9 |
| 85 | 124.8 | 126.2 | 116.3 | 120.2 |
| 90 | 120.0 | 119.9 | 110.5 | 112.3 |

Referring to Table 1, the Example samples in which the cBN content by percentage was in the range of 60 vol % to 90 vol % had a bending strength of 115 kgf/mm$^2$ or more. Further, it can be confirmed that regarding an Example sample and a Comparative Example sample that are substantially identical to each other in terms of the cBN content by percentage and the amount of the added catalyst element, the Example sample has a higher bending strength. Moreover, regarding an Example sample in which 1.5 mass % of the catalyst element is added and a Comparative Example sample in which 5 mass % of the catalyst element is added that are substantially identical to each other in terms of the cBN content by percentage, the Example sample also has a higher bending strength. It can also be confirmed that the Example samples in which the cBN content by percentage is 70 vol % or more and 80 vol % or less have a bending strength of more than 125 kgf/mm² and thus have a particularly higher bending strength as compared with the Comparative Example samples.

Experiment 2

In Experiment 2, the toughness of the Example samples to be evaluated and the Comparative Example samples to be evaluated was evaluated. Specifically, with a tool in which a cBN sintered body was used, a work material of Steel Type SKD11-6V with a hardness HRC of 64, 100 mm in diameter×300 mm in length, and six V-shaped grooves in the axial direction on the surface, was intermittently cut under the conditions that the cutting rate was 100 m/min, the feed rate was 0.2 mm/rev, and the cut size was 0.15 mm. Then, the time elapsed before occurrence of fracture to the cBN sintered body was evaluated. The results of the measurement are shown in Table 2

Results of Experiment 2

TABLE 2

|  | Example Samples | | Comparative Example Samples | |
| --- | --- | --- | --- | --- |
| cBN content (mass %) | catalyst element content 1.5 mass % time elapsed before fracture (min) | catalyst element content 5 mass % time elapsed before fracture (min) | catalyst element content 1.5 mass % time elapsed before fracture (min) | catalyst element content 5 mass % time elapsed before fracture (min) |
| 60 | 2.22 | 2.33 | 2.01 | 2.12 |
| 65 | 2.33 | 2.38 | 2.05 | 2.26 |
| 70 | 2.86 | 2.92 | 2.28 | 2.41 |
| 75 | 3.30 | 3.28 | 2.75 | 3.02 |
| 80 | 2.67 | 2.96 | 2.08 | 2.44 |
| 85 | 2.02 | 2.15 | 1.72 | 1.89 |
| 90 | 1.48 | 1.66 | 0.75 | 1.22 |

Referring to Table 2, regarding the Example samples, the time elapsed before occurrence of fracture was 1.5 minutes or more. Further, it can be confirmed that regarding an Example sample and a Comparative Example sample that are substantially identical to each other in terms of the cBN content by percentage and the amount of the added catalyst element, the time elapsed before occurrence of fracture to the Example sample is longer by 5% or more, and therefore the Example sample is superior in toughness. Moreover, regarding an Example sample in which 1.5 mass % of the catalyst element is added and a Comparative Example sample in which 5 mass % of the catalyst element is added that are substantially identical to each other in terms of the cBN content by percentage, it can be confirmed that the time elapsed before occurrence of fracture to the Example sample is also longer and therefore the Example sample is superior in toughness.

From the results of Experiment 1 and Experiment 2, it can be confirmed that the Example samples of the present invention have superior bending strength and toughness even when the content by percentage of the catalyst element is low, namely 5 mass % or less, as compared with the Comparative Example samples having substantially the same content by percentage of cBN as the Example samples.

Example 2

A scanning transmission electron microscope (STEM) was used to observe the degree of scatter of the binder and the catalyst element in the cBN sintered body in the embodiment of the present invention. Further, an image of a region of 8 μm×8 μm of the cBN sintered body was acquired, a composition analysis was performed on line segments along which the image was divided into partial regions in four rows and four columns, and the degree of dispersion of the catalyst element in the binder was evaluated.

Example Samples

Among the Example samples in Example 1 described above, the cBN sintered body in which the cBN content by percentage was 80 vol % and the catalyst element (Co, Cr) was 1.5 mass % was used as an Example sample in Example 2.

Comparative Example Samples

Initially, a cBN powder having an average particle size of approximately 1.2 μm and a catalyst element, specifically a powder of Ni carbide and Mo carbide having an average particle size of 0.5 μm were prepared at a weight ratio of 1:1. As a binder, a mixture of TiN and Al was heat-treated and the resultant compound was milled and mixed to thereby produce a powder. A mixture of the cBN powder, the catalyst element powder, and the binder powder was produced so that the content by percentage of cBN was 80 vol % and the content by percentage of Ni and Mo was 1.5 mass % in the cBN sintered body. The mixture was held at a pressure of 5.8 GPa and a temperature of 1400° C. for 20 minutes and accordingly sintered, and thus a cBN sintered body was produced.

Experiment 3

First, as described above, the STEM was used to observe the degree of scatter of the binder and the catalyst element in the cBN sintered body. Further, with the STEM, an image of a region of 8 μm<8 μm of the cBN sintered body was acquired, a composition analysis was performed based on EDX on line segments along which the image was divided into partial regions in four rows and four columns, and the degree of dispersion of the added catalyst element in the binder was evaluated. For the composition analysis. JEM-2100F manufactured by JEOL Ltd. was used and the beam spot size was set to 0.4 nm. Dispersion of the added catalyst element in the binder was evaluated based on the results of the composition analysis in the following way.

First, a maximum value among the sums, which were each the sum of a detected peak value (peak intensity) of B and a detected peak value of N at a measurement point, at the all measurement points was determined, a measurement point at which the sum of the detected peak of B and the detected peak of N was a half or less of the determined maximum value was identified as a binder-portion measurement point, and the total number of all binder portion measurement points was determined.

Next, the total number of binder-portion measurement points at which the detected peak value of the catalyst element was 0 and thus the catalyst element was not detected was determined, and the ratio of this total number to the total number of all binder-portion measurement points was calculated. Namely, the fact that this ratio is lower means that the catalyst element disperses to a greater degree in the binder. In this Example, two different catalyst elements, namely Co and Cr were added in the Example samples and the Comparative Example samples each. The measurement points at which the two different catalyst elements were not simultaneously detected were identified as the measurement points at which no catalyst element was detected, and the total number thereof was determined. This is for the reason that Co and Cr (or Ni and Mo) have respective effects different from each other on cBN, and the excellent fracture resistance is achieved by Co and Cr (or Ni and Mo) simultaneously affecting cBN. Specifically, it is considered that Co affects B in cBN and Cr affects N in cBN.

It should be noted that the STEM observation and the composition analysis were done by means of JEM-2100F manufactured by JEOL Ltd.

Results of Experiment 3

Figure 4:
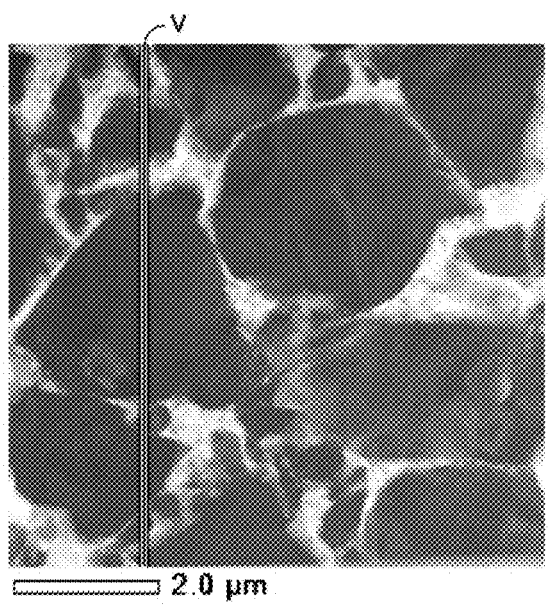
FIG. 4 shows a structure image of an Example sample in Example 2 of the present invention.
Figure 5:
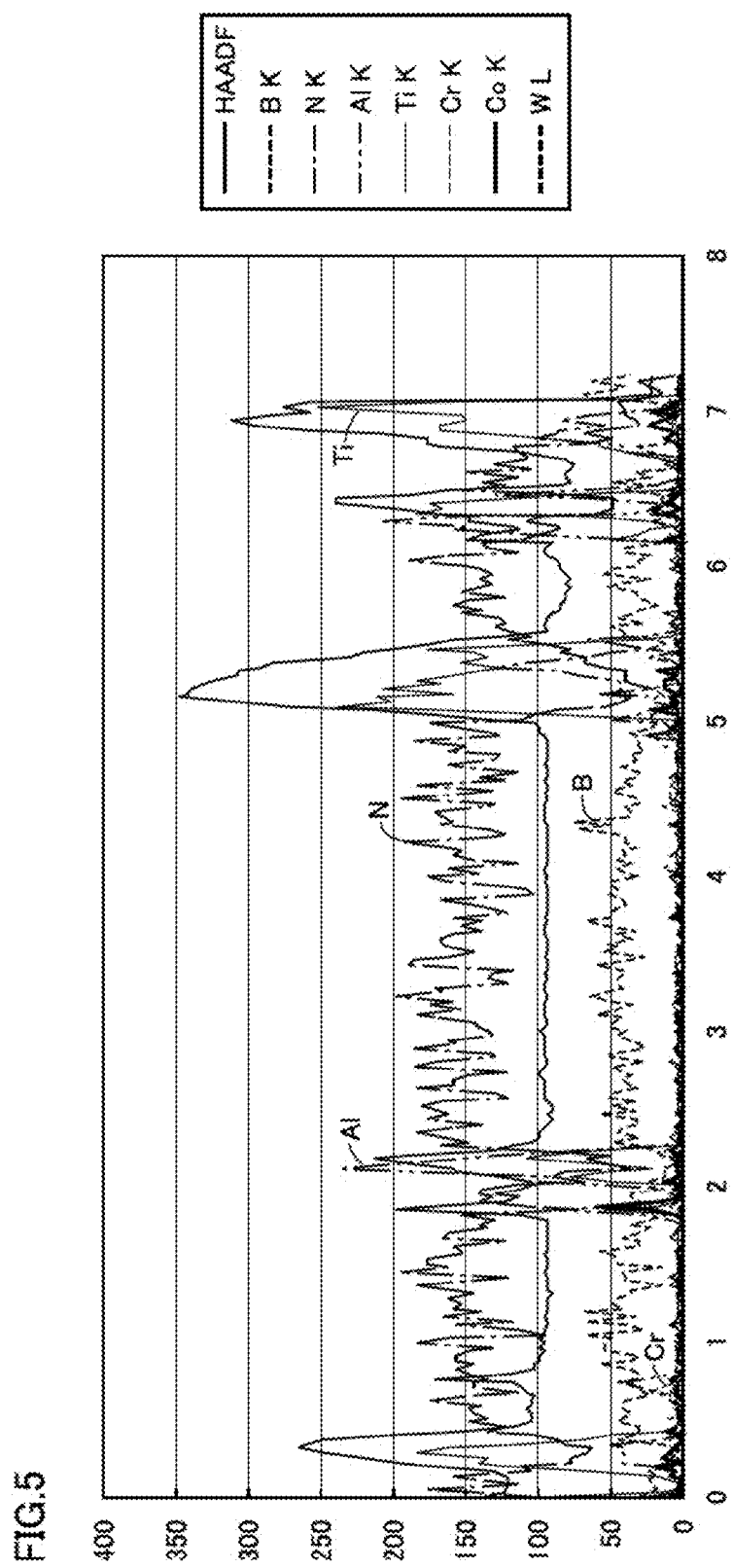
FIG. 5 is a diagram showing characteristics obtained from a composition analysis performed on a line V in FIG. 4.
Figure 6:
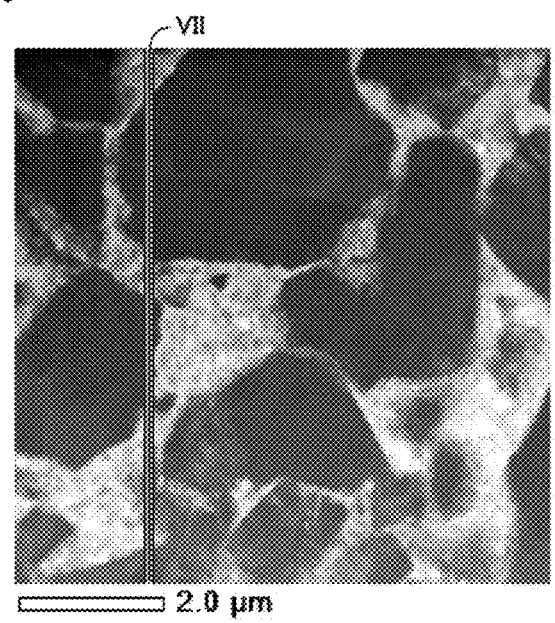
FIG. 6 shows a structure image of a Comparative Example sample in Example 2 of the present invention.
Figure 7:
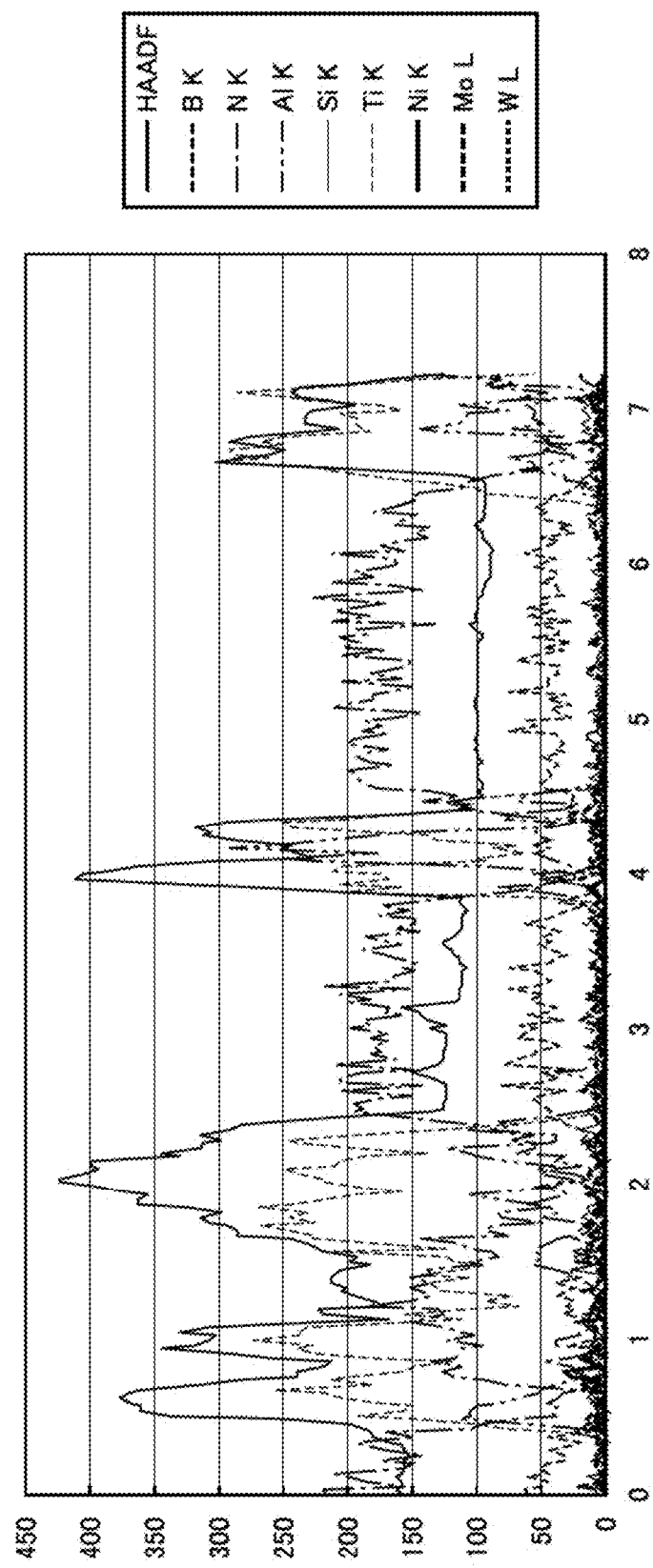
FIG. 7 is a diagram showing characteristics obtained from a composition analysis performed on a line VII in FIG. 6.

FIGS. 4 and 6 each show an image obtained through observation of a region of 8 μm×8 μm of each of the Example samples and the Comparative Example samples, based on the STEM High Angle Angular Dark Field (HAADF) method. Further, the spectrum obtained through a composition analysis performed on a line shown in each of FIGS. 4 and 6 is shown in each of FIGS. 5 and 7. Since FIGS. 4 and 6 each show an HAADF image, the observed B and C constituting cBN are darker while the observed Co. Cr, Ti, and the like constituting the catalyst element or the binder are brighter. This is applied as well to the spectrum shown in FIGS. 5 and 7. It can thus be confirmed that in the Example samples the binder and the catalyst element disperse more uniformly around cBN, relative to the Comparative Example samples.

Further, on each line segment along which the images shown in FIGS. 4 and 6 were each divided into partial regions in four rows and four columns, the composition analysis was performed based on EDX, and the above-described ratio was determined based on this. This ratio was 23.6% for the Example samples and 38.4% for the Comparative Example samples.

From the results of Experiment 3, it can be confirmed that in the Example samples of the present invention, the catalyst element disperses to a greater degree in the binder as compared with the Comparative Example samples in which the amount of the added catalyst element is substantially the same as that of the Example samples.

While the embodiment and examples of the present invention have heretofore been described, it should be construed that the embodiment disclosed herein is given by way of illustration in all respects, not by way of limitation. It is intended that the scope of the present invention is defined by claims and encompasses all modifications and variations equivalent in meaning and scope to the claims.

REFERENCE SIGNS LIST 10 specimen; 11 support

The invention claimed is:

1. A cubic boron nitride sintered body comprising cubic boron nitride, a binder, and a catalyst element of a metal,
   a content by percentage of said cubic boron nitride being 50 vol % or more and 85 vol % or less,
   a content by percentage of said catalyst element being 0.5 mass % or more and 5 mass % or less, and
   said binder including: at least one selected from the group consisting of nitrides, carbides, borides, and oxides of Group 4a elements, Group 5a elements, and Group 6a elements in the periodic table, and solid solutions thereof; and an aluminum compound, wherein
   an image obtained through observation of a region of 8 μm×8 μm of a structure of said cubic boron nitride sintered body with a scanning transmission electron microscope is divided along line segments into partial regions in four rows and four columns, a composition analysis is performed on the line segments, and a sum of a detected peak value of nitrogen and a detected peak value of boron at each of arbitrary measurement points on said line segments is calculated,
   a measurement point at which said sum is a half or less of a maximum value among said sums at all measurement points respectively is identified as a binder-portion measurement point, and
   a ratio of the number of measurement points at which said catalyst element is not detected among said binder-portion measurement points, to a total number of all said binder-portion measurement points is 30% or less, wherein said catalyst element includes at least one element selected from the group consisting of cobalt, chromium, nickel and molybdenum.

2. The cubic boron nitride sintered body according to claim 1, wherein a content by percentage of said cubic boron nitride is 70 vol % or more and 80 vol % or less, and said cubic boron nitride sintered body has a bending strength of more than 125 kgf/mm2.

* * * * *